United States Patent
Chang et al.

(10) Patent No.: US 12,500,169 B2
(45) Date of Patent: Dec. 16, 2025

(54) EMBEDDED PACKAGING STRUCTURE

(71) Applicant: INDUSTRIAL TECHNOLOGY RESEARCH INSTITUTE, Hsinchu (TW)

(72) Inventors: Jing-Yao Chang, New Taipei (TW); Yu Chih Wang, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 172 days.

(21) Appl. No.: 17/562,350

(22) Filed: Dec. 27, 2021

(65) Prior Publication Data

US 2023/0138349 A1     May 4, 2023

Related U.S. Application Data

(60) Provisional application No. 63/273,597, filed on Oct. 29, 2021.

(51) Int. Cl.
*H01L 23/532* (2006.01)
*H01L 21/768* (2006.01)
(Continued)

(52) U.S. Cl.
CPC .... *H01L 23/53238* (2013.01); *H01L 23/5283* (2013.01); *H01L 24/32* (2013.01);
(Continued)

(58) Field of Classification Search
CPC .......... H01L 23/5389; H01L 23/49827; H01L 23/5384; H01L 2224/08165; H01L 2224/16165; H01L 2224/16235; H01L 2224/32165; H01L 2224/32235; H01L 2224/40165; H01L 2224/40235;
(Continued)

(56) References Cited

U.S. PATENT DOCUMENTS 8,120,158 B2    2/2012    Ewe et al.
8,630,097 B2    1/2014    Kim et al.
(Continued)

FOREIGN PATENT DOCUMENTS

CN     110838475 A    2/2020
TW     200913826 A    3/2009
(Continued)

OTHER PUBLICATIONS

Lars Boettcher, et al., Development of Embedded Power Electronics Modules, 2012 4th Electronic System-Integration Technology Conference, 2012, pp. 1-6.
(Continued)

*Primary Examiner* — Julio J Maldonado
*Assistant Examiner* — Stanetta D Isaac
(74) *Attorney, Agent, or Firm* — Maschoff Brennan

(57) ABSTRACT

An embedded packaging structure includes a die, a sintered metal layer, an encapsulation layer and a conductive via. The die includes a metallic bonding layer. Sintered metal layer is bonded to the metallic bonding layer. The encapsulation layer covers the die. The conductive via is provided in a blind hole of the encapsulation layer, and the conductive via is electrically connected with the metallic bonding layer through the sintered metal layer.

17 Claims, 9 Drawing Sheets

(51) Int. Cl.
  *H01L 23/00* (2006.01)
  *H01L 23/48* (2006.01)
  *H01L 23/528* (2006.01)
(52) U.S. Cl.
  CPC .. *H01L 21/76802* (2013.01); *H01L 21/76873* (2013.01); *H01L 23/481* (2013.01); *H01L 2224/32245* (2013.01); *H01L 2924/3511* (2013.01); *H01L 2924/35121* (2013.01)
(58) Field of Classification Search
  CPC . H01L 2224/48165; H01L 2224/48235; H01L 2225/06548; H01L 24/82; H01L 24/24; H01L 24/26; H01L 24/29; H01L 24/83; H05K 1/00–189; H05K 2203/00–308; H05K 3/00–4697
  See application file for complete search history.

(56) References Cited

U.S. PATENT DOCUMENTS

| | | | |
|---|---|---|---|
| 9,209,151 | B2 | 12/2015 | Chauhan et al. |
| 9,312,234 | B2 | 4/2016 | Sunaga et al. |
| 10,186,477 | B2 | 1/2019 | Gowda et al. |
| 10,777,503 | B2 | 9/2020 | Gottwald et al. |
| 2008/0149379 | A1* | 6/2008 | Nagase .................. H01L 24/24 |
| | | | 257/E23.178 |
| 2013/0114212 | A1* | 5/2013 | Tada .................... H05K 1/0206 |
| | | | 252/514 |
| 2013/0256856 | A1* | 10/2013 | Mahler .................. H01L 24/92 |
| | | | 257/676 |
| 2014/0070397 | A1* | 3/2014 | Viswanathan .......... H01L 24/32 |
| | | | 257/706 |
| 2016/0254761 | A1* | 9/2016 | Furukawa ............. H01L 21/283 |
| | | | 363/131 |
| 2018/0331033 | A1* | 11/2018 | Gottwald ............ H01L 21/4857 |
| 2020/0350280 | A1 | 11/2020 | Chang et al. |
| 2021/0242167 | A1* | 8/2021 | Yoo ..................... H01L 25/0655 |

FOREIGN PATENT DOCUMENTS

| | | |
|---|---|---|
| TW | 201337952 A | 9/2013 |
| TW | I666743 B | 7/2019 |

OTHER PUBLICATIONS

Daniel Kearney et al., PCB Embedded Power Electronics for Low Voltage Applications, CIPS 2016; 9th International Conference on Integrated Power Electronics Systems, 2016, pp. 1-6.
Taiwanese Office Action issued in corresponding application No. 110148842, dated Nov. 10, 2022.

* cited by examiner

EMBEDDED PACKAGING STRUCTURE

CROSS-REFERENCE TO RELATED APPLICATIONS

This non-provisional application claims priority under 35 U.S.C. § 119(a) on Patent Application No. 63/273,597 filed in U.S. on 2021 Oct. 29, the entire contents of which are hereby incorporated by reference.

BACKGROUND

1. Technical Field

This present disclosure relates to a packaging structure for electronic component.

2. Related Art

With the improvement of integrated circuit fabrication technology, some novel packaging methods have been developed in the related technology for packaging the integrated circuit. Recently, embedded packaging technology, which was previously applied to circuit board manufacturing, has been noticed and widely applied to system-in-package (SIP) of power semiconductor components. Since wearable electronic devices and portable devices are the future trend of electronic products, the embedded packaging technology is considered having a certain research value due to its advantages of low cost and small packaging size. An embedded packaging structure generally consists of a semiconductor die embedded in a dielectric material, and a signal trace (circuit for signal transmission) outside the dielectric material. The electrical connection between the semiconductor die and the signal trace is accomplished by a metallic conductive via. Usually, a blind hole is formed in the dielectric material by a laser drilling process to expose the semiconductor die for electrical connection, and the blind hole is filled with metal to form a metallic conductive via contacting a contact point of the semiconductor die.

A high power laser source used in the laser drilling process may strike a metal layer serving as the contact point of the semiconductor die or even a main body of the die Therefore, the fabrication of embedded packaging structure includes a step of forming a barrier layer (or called stop layer) for laser drilling above the metal layer.

SUMMARY

According to one embodiment of the present disclosure, an embedded packaging structure includes a die, a sintered metal layer, an encapsulation layer and a conductive via. The die includes a metallic bonding layer. sintered metal layer is bonded to the metallic bonding layer. The encapsulation layer covers the die. The conductive via is provided in a blind hole of the encapsulation layer, and the conductive via is electrically connected with the metallic bonding layer through the sintered metal layer.

According to another embodiment of the present disclosure, an embedded packaging structure includes a die, a sintered metal layer, a copper foil, an encapsulation layer and a conductive via. The die includes a metallic bonding layer. The sintered metal layer is bonded to the metallic bonding layer. The copper foil is bonded to the sintered metal layer, and the sintered metal layer is provided between the metallic bonding layer and the copper foil. The encapsulation layer covers the die. The conductive via is provided in a blind hole of the encapsulation layer, and the conductive via is electrically connected with the metallic bonding layer through the copper foil and the sintered metal layer.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present disclosure. The following embodiments further illustrate various aspects of the present disclosure, but are not meant to limit the scope of the present disclosure.

Figure 1:
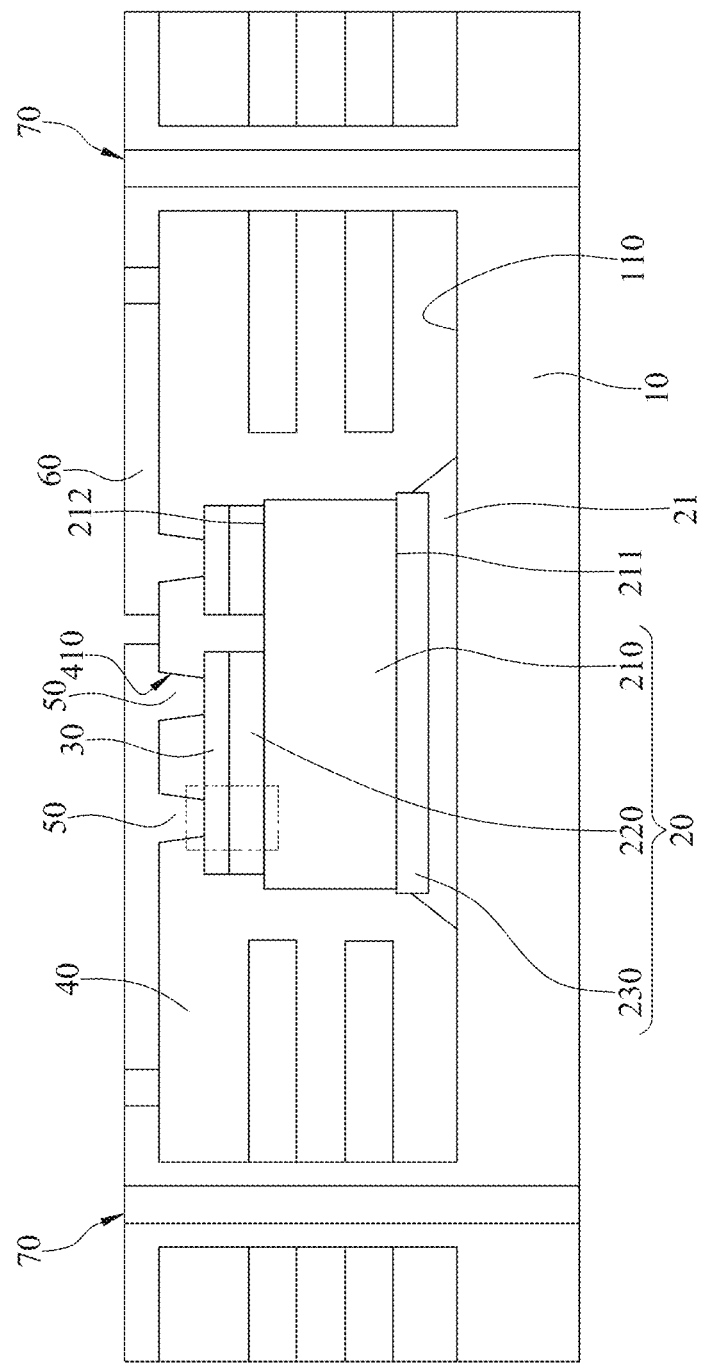
FIG. 1 is a schematic view of an embedded packaging structure according to one embodiment of the present disclosure.
Figure 2:
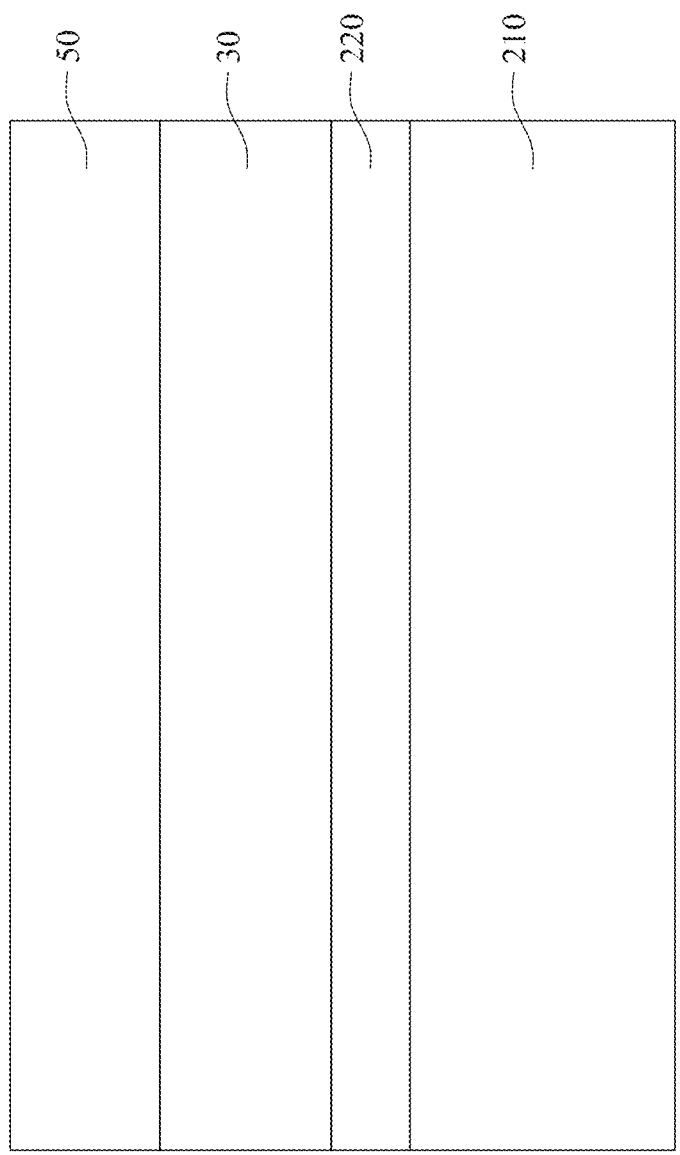
FIG. 2 is a partially enlarged view of the embedded packaging structure in FIG. 1.

Please refer to FIG. 1 and FIG. 2. FIG. 1 is a schematic view of an embedded packaging structure according to one embodiment of the present disclosure. FIG. 2 is a partially enlarged view of the embedded packaging structure in FIG. 1. In this embodiment, an embedded packaging structure 1a includes a substrate 10, a die 20, a sintered metal layer 30, an encapsulation layer 40, a conductive via 50, a signal trace layer 60 and a plating through hole (PTH) 70. The substrate 10 of the embedded packaging structure 1a may be bonded to a printed circuit board (not shown in the drawings).

The substrate 10, for example but not limited to, is a metal substrate made of aluminum (Al), lead (Pb) or copper (Cu). The die 20 includes a main body 210 and a metallic bonding layer 220. The die 20, for example but not limited to, is a power semiconductor component, a radio frequency (RF) component, an insulated gate bipolar transistor (IGBT), a power diode or other electronic components containing semiconductor material (e.g. Si, GaAs, SiC, GaN, $Ga_2O_3$), and the die 20 is bonded to the substrate 10. The metallic bonding layer 220 may be a contact pad of the die 20, and the main body 210 may be a portion of the die 20 containing silicon-based semiconductor or a portion of the die 20 except the metallic bonding layer 220.

The metallic bonding layer 220 of the die 20 is provided on the surface of main body 210. In detail, the metallic bonding layer 220 is formed on the top surface 212 of the main body 210. In other words, one side of the die 20 is bonded to the substrate 10, and a metallic bonding layer 220 is provided at the opposite side of the die 20. The metallic bonding layer 220 may include a metallic layer contain aluminum-copper or aluminum-silicon alloy, and another layer or a stack of sub-layers which is formed on the metallic layer. The stack of sub-layers may include Cu sub-layer, Cu—Au sub-layer, Ni—Pd—Au sub-layer or Ni—Ag sub-layer, and gold (Au) or silver (Ag) is taken as the outermost sub-layer to protect the metallic bonding layer from oxidation. The die 20 may further include a lower metallic bonding layer 230 contacting the bottom surface 211 of the main body 210 and is bonded to the substrate 10 through a metallic adhesive layer 21. The metallic adhesive layer 21 may be a solder or a sintered metal such as sintered silver, sintered copper, sintered copper with sintered silver sintered Cu—Ag and sintered nickel.

Figure 3:
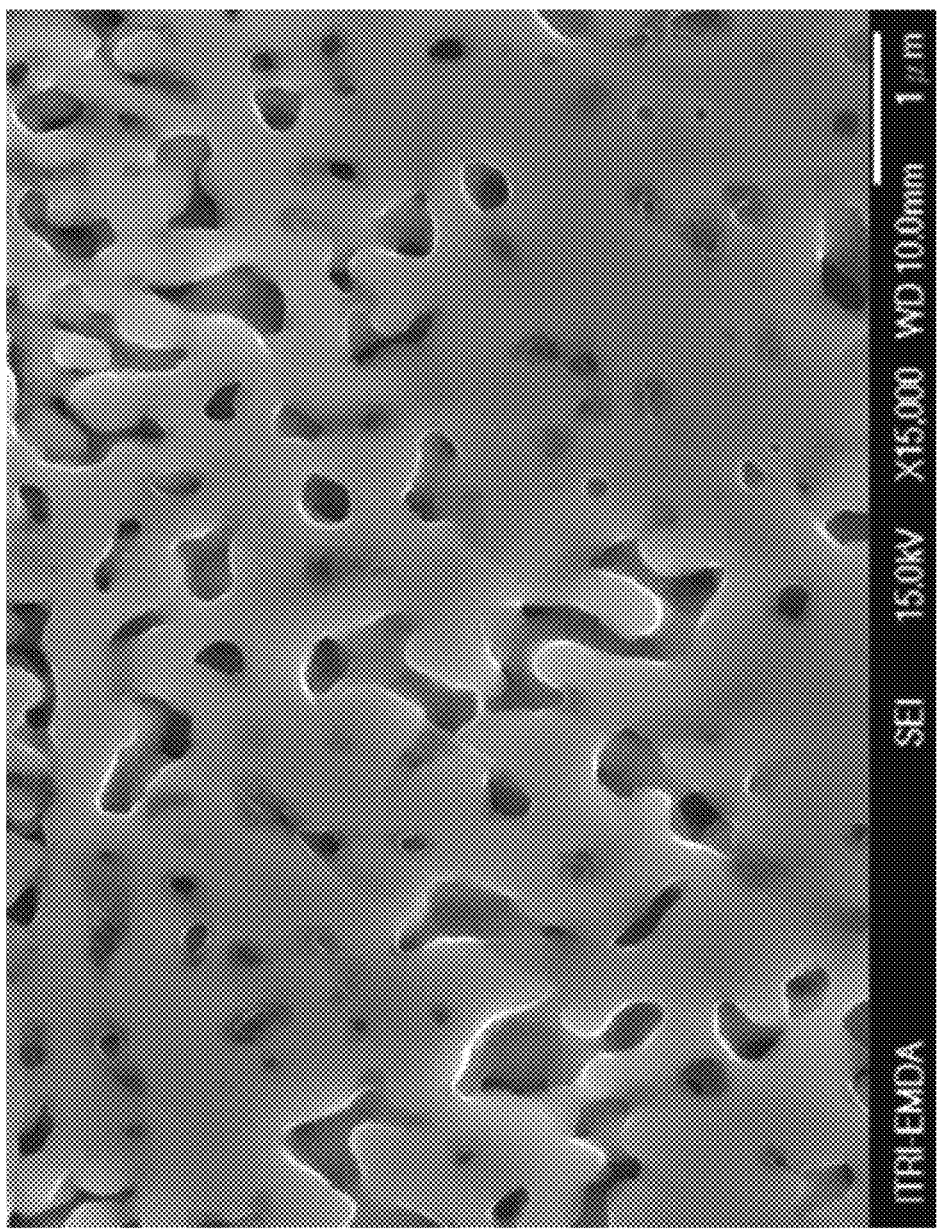
FIG. 3 is a scanning electron microscope (SEM) image of a sintered metal layer according to one embodiment of the present disclosure.

The sintered metal layer 30 is bonded to the metallic bonding layer 220 of the die 20. The sintered metal layer 30 includes solid metal formed by fusing raw materials in a heating process or a pressurization process. More specifically, the sintered metal layer 30 may include sintered copper, sintered silver or a combination thereof. The sintered metal layer 30 may have physical properties suitable for transmitting signals for telecommunications; for example, the thickness of the sintered metal layer 30 may be equal to or less than 60.0 μm, the thickness of the sintered metal layer 30 may be from 10.0 μm to 30.0 μm, the thermal conductivity of the sintered metal layer 30 may be equal to or greater than 190.0 W/m K, and the electrical resistivity the sintered metal layer 30 may be from $2.5 \times 10^{-8}$ Ω·m to $8.0 \times 10^{-8}$ Ω·m. FIG. 3 is a SEM image of a sintered metal layer according to one embodiment of the present disclosure, wherein the sintered metal layer 30 includes a submicron porous structure.

The encapsulation layer 40 covers the die 20. In detail, the encapsulation layer 40 is formed on the substrate 10 and covers the die 20 and the sintered metal layer 30. The encapsulation layer 40 may include one or more dielectric layers, and the dielectric layer may be a silicon oxide layer or a nitrogen oxide layer.

The conductive via 50 is provided in a blind hole 410 of the encapsulation layer 40. Specifically, the blind hole 410 may be formed in the encapsulation layer 40 by using a laser drilling process to remove part of the encapsulation layer 40 and thereby obtain the blind hole 410 exposing the sintered metal layer 30, and then the conductive via 50 is formed in the blind hole 410. The conductive via 50 is electrically connected with the metallic bonding layer 220 of the die 20 through the sintered metal layer 30.

The signal trace layer 60 is provided on the encapsulation layer 40 and the conductive via 50, and the conductive via 50 is electrically connected with the signal trace layer 60. The signal trace layer 60 may be made of the same metal material as the substrate 10. In addition, the signal trace layer 60 may be covered with electrically insulated material (not shown in the drawings) to ensure a safe design for the prevention of leakage current.

The PTH 70 extends through the encapsulation layer 40. A metal film is coated on the inner wall of the PTH 70 to connect the signal trace layer 60 with the substrate 10, and this metal film may be made of the same metal material as the substrate 10 and the signal trace layer 60.

Figure 4:
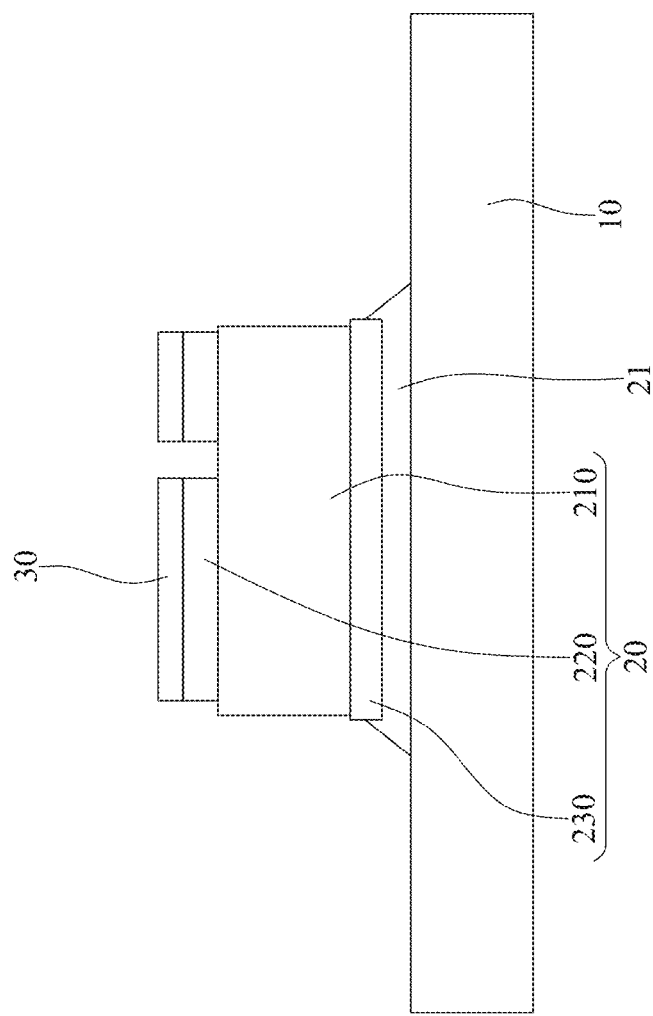
FIG. 4 through FIG. 7 are schematic views of fabricating the embedded packaging structure in FIG. 1.

The following describes a method of fabricating the embedded packaging structure 1*a*. FIG. 4 through FIG. 7 are schematic views of fabricating the embedded packaging structure in FIG. 1. As shown in FIG. 4, the substrate 10, the die 20 mounted on the top surface 110 of the substrate 10, and the sintered metal layer 30 bonded to the metallic bonding layer 220 of the die 20 are provided, wherein the sintered metal layer 30 serves as a barrier layer for the subsequent laser drilling process. In detail, a wafer which has been processed to form integrated circuits may be cut by a diamond cutter to obtain one or more dies 20. The die 20 is then bonded to the top surface 110 of substrate 10, and the sintered metal layer 30 is formed on the die 20. The bonding of the die 20 to the substrate 10, for example, is referred to that the lower metallic bonding layer 230 on the bottom surface 211 of the main body 210 of the die 20 is bonded to the top surface 110 of the substrate 10 by a metallic adhesive layer 21.

The sintered metal layer 30 may be formed on the die 20 in several ways. In one way, a sintered metal is firstly obtained by a conventional sintering process and then shaped into a sheet; next, the sintered metal sheet is placed on the metallic bonding layer 220 of the die 20 and thermocompressed at a temperature of 220° C. to 300° C. to form the sintered metal layer 30 on the die 20. In another way, a slurry containing metal powder is spread on the metallic bonding layer 220, and then thermocompressed at a temperature of 220° C. to 300° C. to form the sintered metal layer 30 bonded to the metallic bonding layer 220. As to the two exemplary ways, the sintered metal sheet or the slurry containing metal powder is provided at the location where the metallic bonding layer 220 exists, and the sintered metal layer 30 has substantially the same pattern area as or smaller pattern area than the corresponding metallic bonding layer 220; that is, in a top view, it may be observed that the pattern of the sintered metal layer 30 has substantially the same shape as that of the metallic bonding layer 220, and an area of the pattern of the sintered metal layer 30 is equal to or slightly smaller than that of the metallic bonding layer 220.

Figure 5:
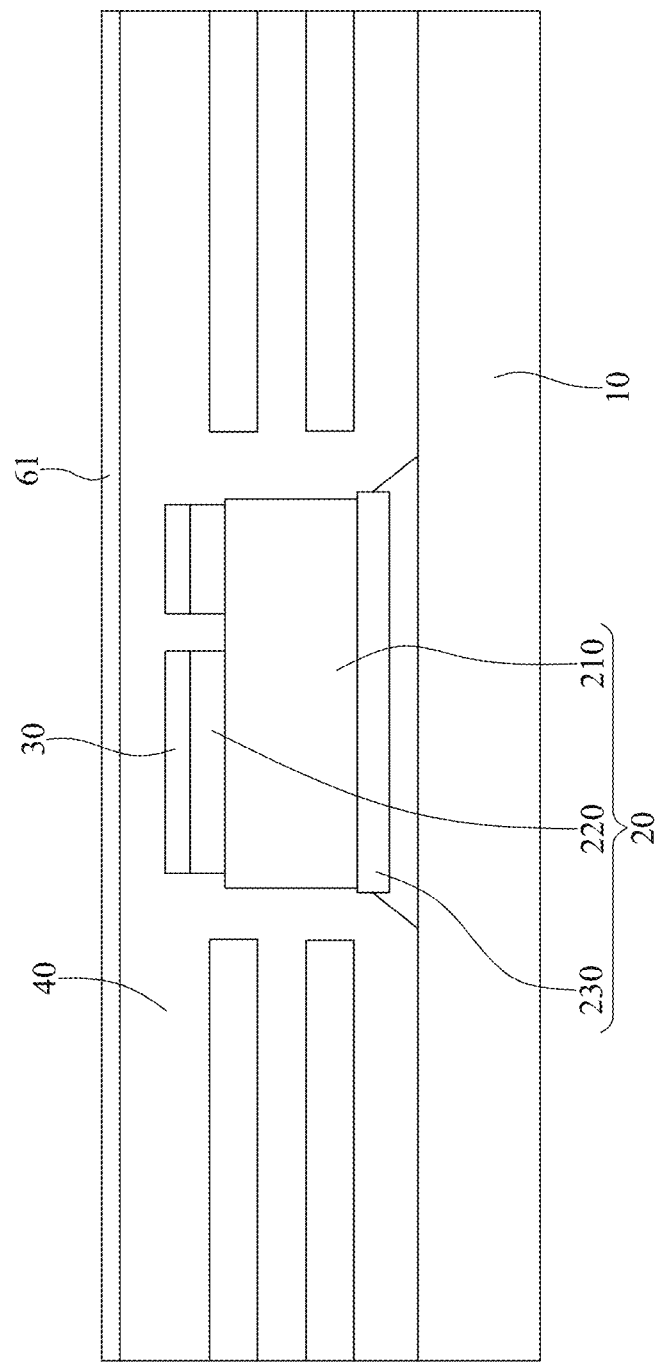

As shown in FIG. 5, the encapsulation layer 40 is formed on the substrate 10 and covers the die 20, the sintered metal layer 30 and the substrate 10. A metal film 61 is formed on the encapsulation layer 40 as a part for forming the signal trace layer 60 in a subsequent step. The encapsulation layer 40 may be configured by chemical vapor deposition epoxy resin, glass fibre epoxy resin or a stack thereof, and the metal film 61 may be formed by copper foil lamination, sputtering or electroplating.

Figure 6:
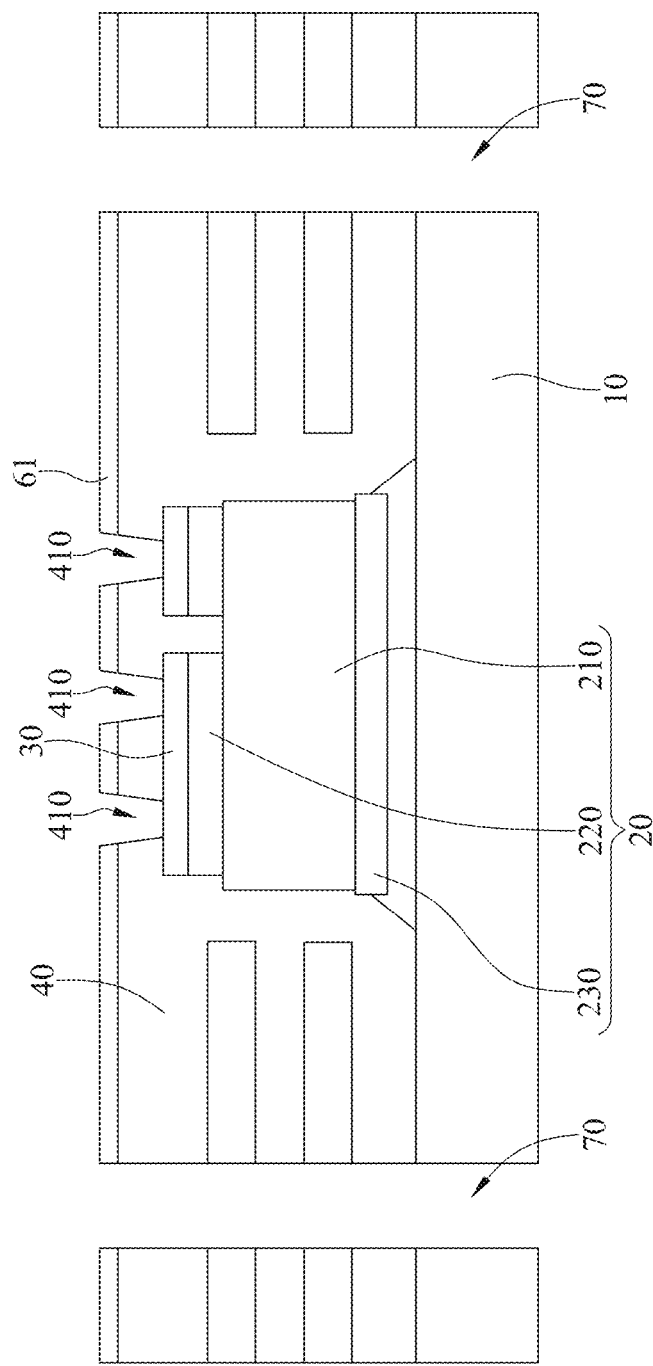

As shown in FIG. 6, the blind hole 410 and the PTH 70 are formed in the encapsulation layer 40. In detail, in a specific region, the encapsulation layer 40 and the metal film 61 may be removed by laser drilling to form the blind hole 410; in another region, the substrate, the encapsulation layer 40 and the metal film 61 may be removed by mechanical drilling to form the PTH 70. The blind hole 410 exposes the sintered metal layer 30. The sintered metal layer 30 features good electrical conductivity and thus has less influence on signal transmission. In addition, the sintered metal layer 30 also features high thermal conductivity and high melting point, such that a laser beam is difficult to breakthrough the sintered metal layer 30, and the heat generated by laser strike can be quickly transferred and does not accumulate nearby the metallic bonding layer 220 of the die 20. Thus, it is helpful to increase the service life of the die 20.

Figure 7:
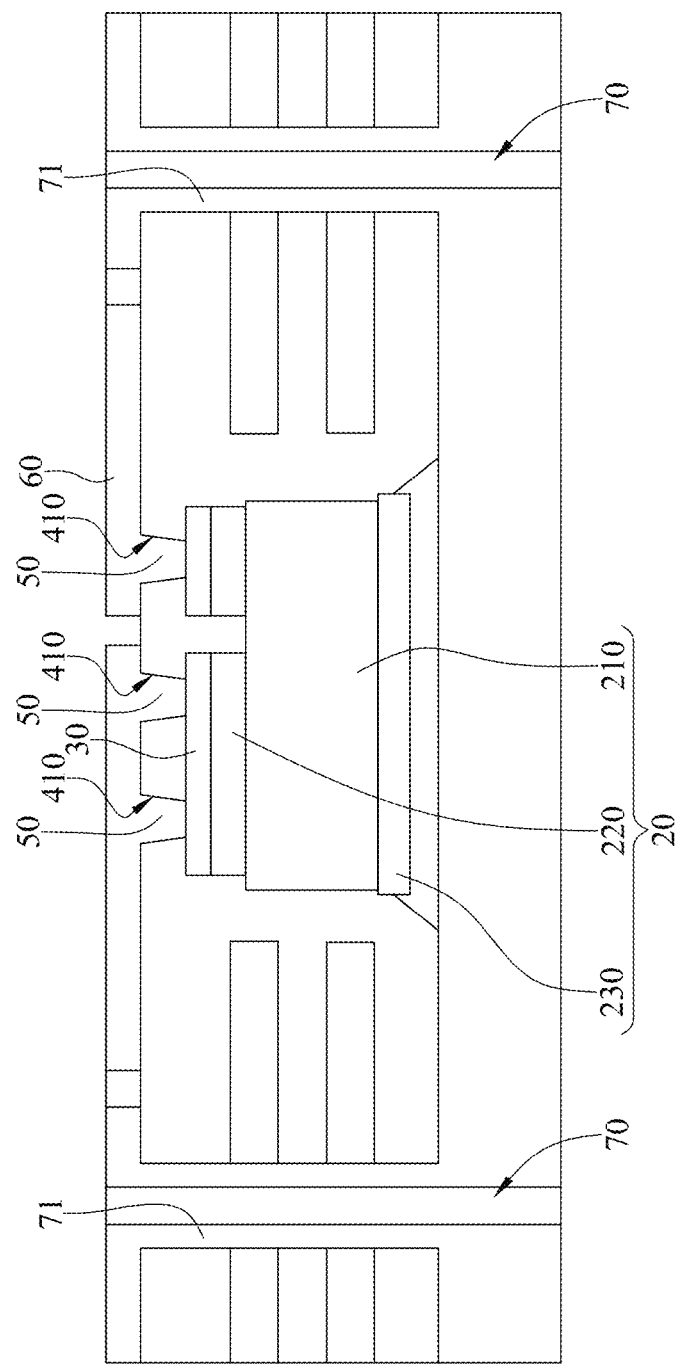

As shown in FIG. 7, the conductive via 50 is formed in the blind hole 410, and a metal film 71 is formed on the inner wall of the PTH 70. In detail, a metal layer, such as copper layer, titanium layer, tungsten layer and so on, may be deposited on the inner wall of the PTH 70 by electroplating to form the conductive via 50 and the metal film 71. The metal film 71 is also formed on the metal film 61 in FIG. 6, and both of the metal films 61 and 71 may be jointly patterned to form the signal trace layer 60. The patterning of the metal films can be accomplished by photolithography and etching processes. In this embodiment, compared to a conventional barrier layer containing electroplated or electroless metal, the sintered metal layer 30 including submicron porous structure is advantageous to increase a contact area between the conductive via 50 containing electroplated copper and the sintered metal layer 30, thereby improving the bonding strength and the reliability of the packaging structure.

Figure 8:
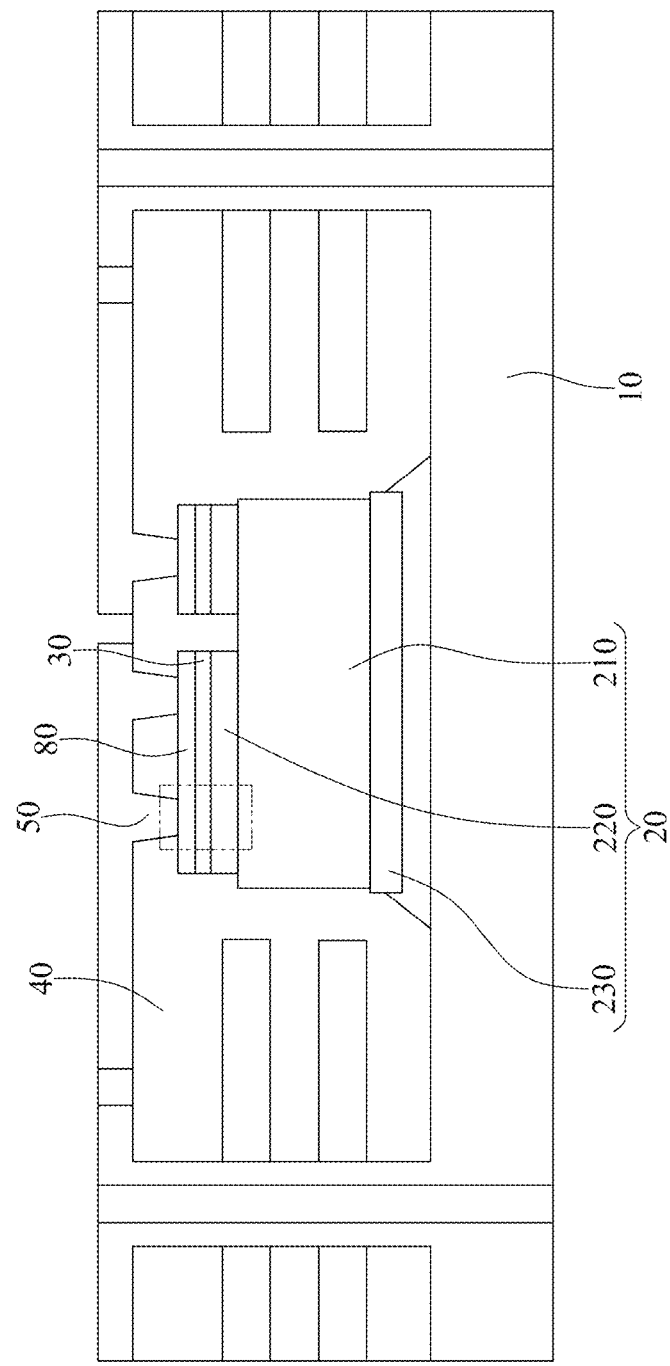
FIG. 8 is a schematic view of an embedded packaging structure according to another embodiment of the present disclosure.
Figure 9:
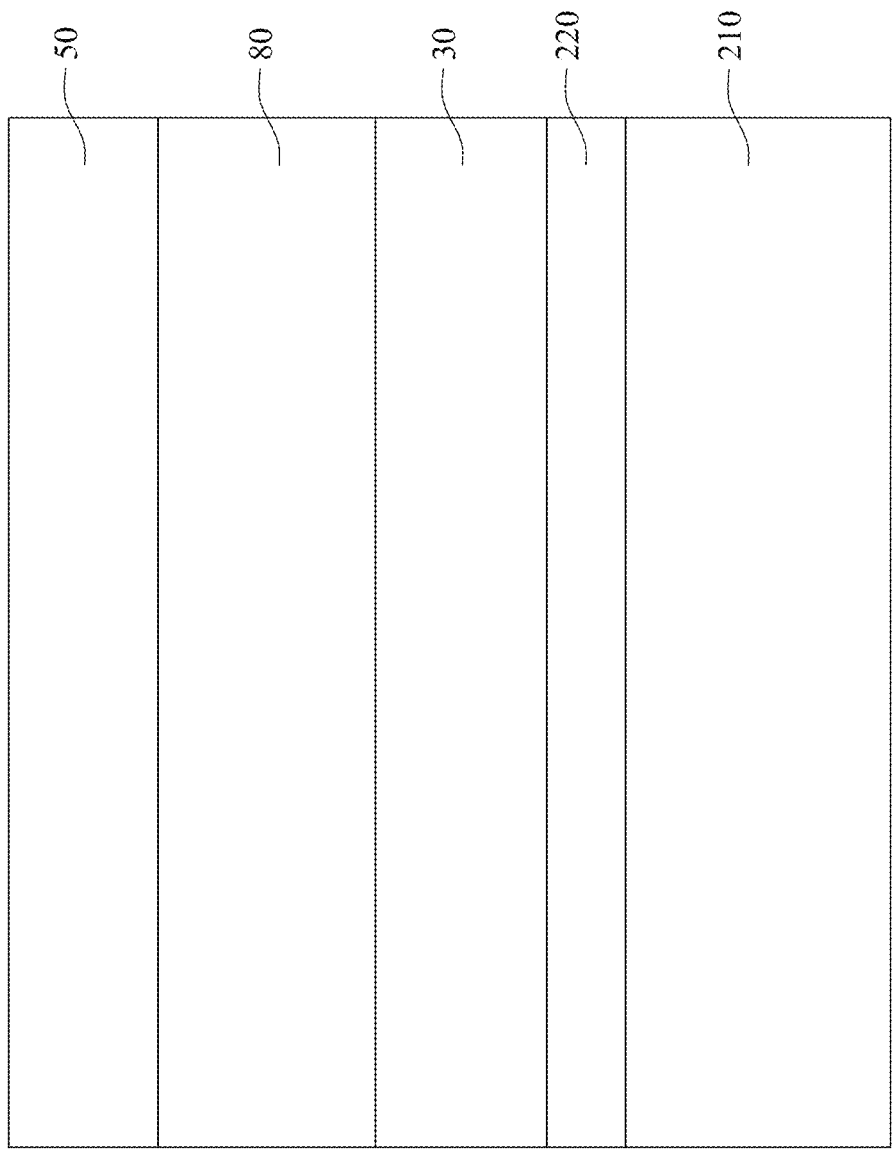
FIG. 9 is a partially enlarged view of the embedded packaging structure in FIG. 8.

The embedded packaging structure disclosed therein may include a copper foil bonded to the sintered metal layer. Please refer to FIG. 8 and FIG. 9. FIG. 8 is a schematic view of an embedded packaging structure according to another embodiment of the present disclosure, and FIG. 9 is a partially enlarged view of the embedded packaging structure in FIG. 8. In this embodiment, an embedded packaging structure 1b includes a substrate 10, a die 20, a sintered metal layer 30, an encapsulation layer 40, a conductive via 50, a signal trace layer 60 and a PTH 70. Any specific configuration of the aforementioned elements can be referred to the previous description related to the embedded packaging structure 1a FIG. 1, and the detail description will be omitted hereafter.

The embedded packaging structure 1b further includes a copper foil 80. The copper foil 80 is bonded to the top side of the sintered metal layer 30, and a thickness of the copper foil 80 is from 50.0 μm to 100.0 μm. The sintered metal layer 30 is provided between the metallic bonding layer 220 of the die 20 and the copper foil 80, and the copper foil 80 contacts the conductive via 50. An exemplary method of bonding the copper foil 80 to the sintered metal layer 30 is that the copper foil 80 is attached to a sintered metal sheet (sintered metal layer 30), and bonded to the sintered metal sheet by thermocompression; or, the copper foil 80 is placed on a slurry containing metal powder (sintered metal layer 30), bonded to the sintered metal layer 30 by thermocompression. The double-layer structure including the sintered metal layer 30 and the copper foil 80 serves as a barrier layer for laser drilling to prevent heat damage due to laser strike from the die 20.

According to the present disclosure, the embedded packaging structure includes the sintered metal layer bonded to the metallic bonding layer of the die. The sintered metal layer features good thermal conductivity and electrical conductivity and thus can be taken as a barrier layer for laser drilling in the fabrication of the embedded packaging structure. Since the sintered metal layer is taken as the barrier layer, the barrier layer can be formed on a die after the wafer is cut into multiple dies. Compared to a conventional barrier layer which is formed to cover all dies before wafer dicing, the sintered metal layer on the die enjoys less internal stress and is less likely to warp and break or even peel off.

Moreover, the sintered metal layer includes submicron porous structure, such that it is advantageous to increase a contact area between the conductive via and the sintered metal layer, thereby improving the bonding strength and the reliability of the packaging structure.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An embedded packaging structure, comprising:
   a die comprising a metallic bonding layer;
   a sintered metal layer bonded to the metallic bonding layer;
   an encapsulation layer covering the die; and
   a conductive via provided in a blind hole of the encapsulation layer, wherein the conductive via is electrically connected with the metallic bonding layer through the sintered metal layer, and the sintered metal layer is between the metallic bonding layer and the conductive via; and
   wherein the sintered metal layer is located outside the blind hole;
   wherein two opposite sides of the sintered metal layer are in contact with the metallic bonding layer and the conductive via, respectively; and
   wherein the sintered metal layer is directly in contact with and located between the metallic bonding layer and the conductive via.

2. The embedded packaging structure according to claim 1, wherein a thickness of the sintered metal layer is equal to or less than 60.0 μm.

3. The embedded packaging structure according to claim 1, wherein the sintered metal layer comprises sintered copper, sintered silver or sintered copper with sintered silver.

4. The embedded packaging structure according to claim 1, wherein the sintered metal layer has same pattern area as or smaller pattern area than the metallic bonding layer.

5. The embedded packaging structure according to claim 1, wherein the conductive via comprises electroplated copper.

6. The embedded packaging structure according to claim 1, wherein the blind hole of the encapsulation layer is formed by laser drilling.

7. The embedded packaging structure according to claim 1, further comprising a metal substrate, wherein the die is bonded to the metal substrate, the encapsulation layer is formed on the metal substrate, a side of the die is bonded to the metal substrate, and the metallic bonding layer is provided on an opposite side of the die.

8. An embedded packaging structure, comprising:
   a die comprising a metallic bonding layer;
   a sintered metal layer bonded to the metallic bonding layer;
   a copper foil bonded to the sintered metal layer, wherein the sintered metal layer is provided between the metallic bonding layer and the copper foil;
   an encapsulation layer covering the die; and
   a conductive via provided in a blind hole of the encapsulation layer, wherein the conductive via is electrically connected with the metallic bonding layer through the copper foil and the sintered metal layer, the sintered metal layer and the copper foil are between the metallic bonding layer and the conductive via; and
   wherein the sintered metal layer is located outside the blind hole;
   wherein two opposite sides of the copper foil are in contact with the sintered metal layer and the conductive via, respectively; and
   wherein the copper foil is directly in contact with and located between the sintered metal layer and the conductive via.

9. The embedded packaging structure according to claim 8, wherein a thickness of the sintered metal layer is equal to or less than 60.0 μm.

10. The embedded packaging structure according to claim 8, wherein a thickness of the copper foil is from 50.0 μm to 100.0 μm.

11. The embedded packaging structure according to claim 8, wherein the sintered metal layer comprises sintered copper, sintered silver or sintered copper with sintered silver.

12. The embedded packaging structure according to claim 8, wherein each of the copper foil and the sintered metal layer has same pattern area as or smaller pattern area than the metallic bonding layer.

13. The embedded packaging structure according to claim 8, wherein the conductive via comprises electroplated copper.

14. The embedded packaging structure according to claim 8, wherein the blind hole of the encapsulation layer is formed by laser drilling.

15. The embedded packaging structure according to claim 8, further comprising a metal substrate, wherein the die is bonded to the metal substrate, the encapsulation layer is formed on the metal substrate, a side of the die is bonded to the metal substrate, and the metallic bonding layer is provided on an opposite side of the die.

16. An embedded packaging structure, comprising:
a die comprising a metallic bonding layer;
a sintered metal layer bonded to the metallic bonding layer, wherein the sintered metal layer comprises sintered copper, sintered silver or sintered copper with sintered silver;
an encapsulation layer covering the die; and
a conductive via provided in a blind hole of the encapsulation layer, wherein the conductive via is electrically connected with the metallic bonding layer through the sintered metal layer; and
wherein the sintered metal layer is located outside the blind hole;
wherein two opposite sides of the sintered metal layer are in contact with the metallic bonding layer and the conductive via, respectively; and
wherein the sintered metal layer is directly in contact with and located between the metallic bonding layer and the conductive via.

17. An embedded packaging structure, comprising:
a die comprising a metallic bonding layer;
a sintered metal layer bonded to the metallic bonding layer, wherein the sintered metal layer comprises sintered copper, sintered silver or sintered copper with sintered silver;
a copper foil bonded to the sintered metal layer, wherein the sintered metal layer is provided between the metallic bonding layer and the copper foil;
an encapsulation layer covering the die; and
a conductive via provided in a blind hole of the encapsulation layer, wherein the conductive via is electrically connected with the metallic bonding layer through the copper foil and the sintered metal layer; and
wherein the sintered metal layer is located outside the blind hole;
wherein two opposite sides of the copper foil are in contact with the sintered metal layer and the conductive via, respectively; and
wherein the copper foil is directly in contact with and located between the sintered metal layer and the conductive via.

* * * * *